United States Patent [19]

Hebel et al.

[11] Patent Number: 4,641,754
[45] Date of Patent: Feb. 10, 1987

[54] QUICK CONNECT FRAME

[75] Inventors: Gregory F. Hebel, Chicago; Gregg A. Temkin, Evanston, both of Ill.

[73] Assignee: Homaco, Inc., Chicago, Ill.

[21] Appl. No.: 819,422

[22] Filed: Jan. 16, 1986

[51] Int. Cl.$^4$ .............................................. A47F 7/00
[52] U.S. Cl. ....................................... 211/26; 361/428
[58] Field of Search ............................ 211/26; 179/98; 361/384, 427, 428, 429, 420, 421; 200/293, 296; 248/165, 49

[56] References Cited

U.S. PATENT DOCUMENTS

| | | | |
|---|---|---|---|
| 2,480,568 | 8/1949 | Garvin | 361/428 X |
| 3,227,487 | 1/1966 | Blanchard et al. | 297/248 |
| 3,420,381 | 1/1969 | Bradfield | 211/26 |
| 3,521,129 | 7/1970 | MacKenzie | 179/98 X |
| 4,519,013 | 5/1985 | Breeze et al. | 361/429 X |
| 4,553,674 | 11/1985 | Yoshikawa | 211/26 |

Primary Examiner—J. Franklin Foss
Attorney, Agent, or Firm—Anthony S. Zummer

[57] ABSTRACT

An improved construction for a quick connect frame is the subject matter of this invention. The instant quick connect frame is used for interconnecting a plurality of wires which wires are part of a communication system. The frame has a pair of uprights and a bridge connecting the uprights. Feet are connected to the bottom of the uprights to hold the uprights in a vertical attitude. A mounting bracket is secured to the uprights to support a block module. A mounting strip is connected to the mounting bracket. The mounting strip includes a support bar and a stiffening bar. The stiffening bar is formed integral with the support bar and is substantially perpendicular to the support bar. An elongated recess is formed in the support bar and the stiffening bar at the junction of the support and stiffener bars. A plurality of spacers is secured to the support bar. Each of the spacers includes an elongated base secured to the support bar and a bar of posts. A mounting bar interconnects the posts. A block bracket is mounted on each of the mounting bars. Each block bracket is adapted to receive a quick connect block. A head is connected to each of the feet. A column is secured to each head and is aligned with its respective upright. An extender foot is fixed to the lower portion of the column for supporting the column in a vertical attitude and thereby the upright.

15 Claims, 9 Drawing Figures

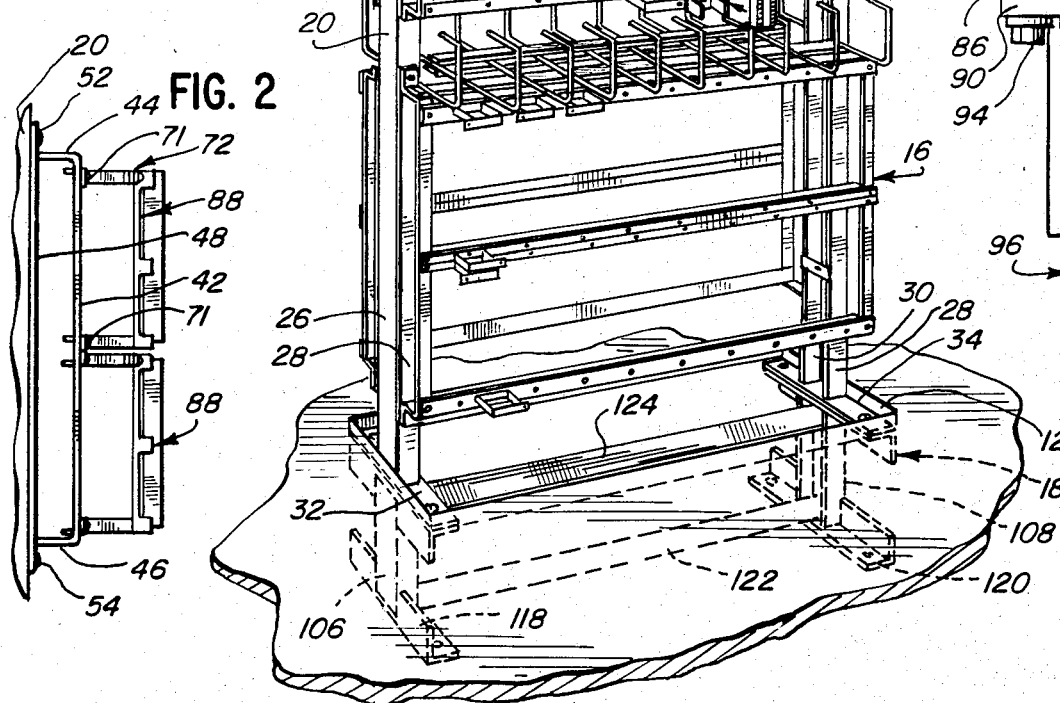

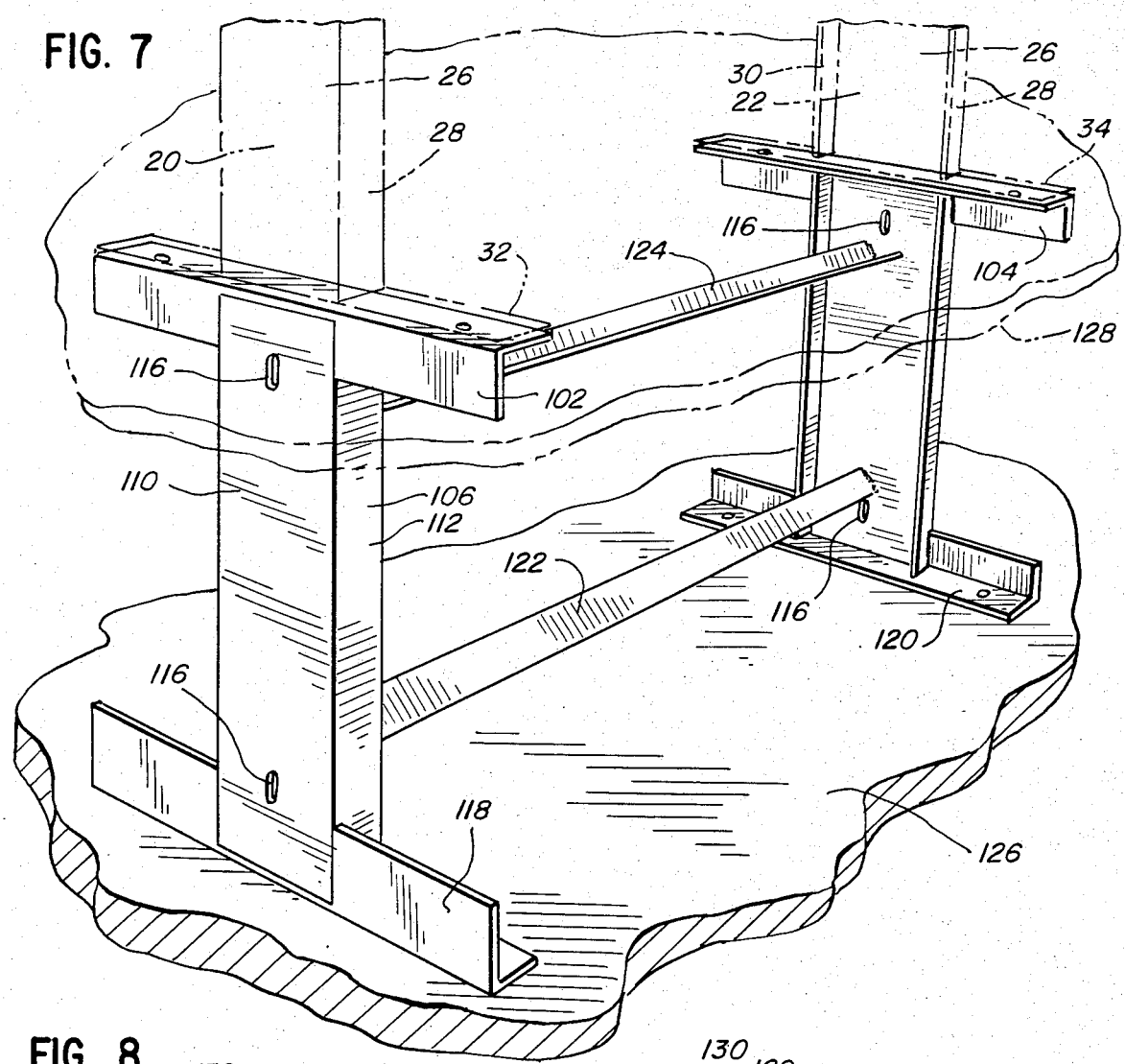
FIG. 7
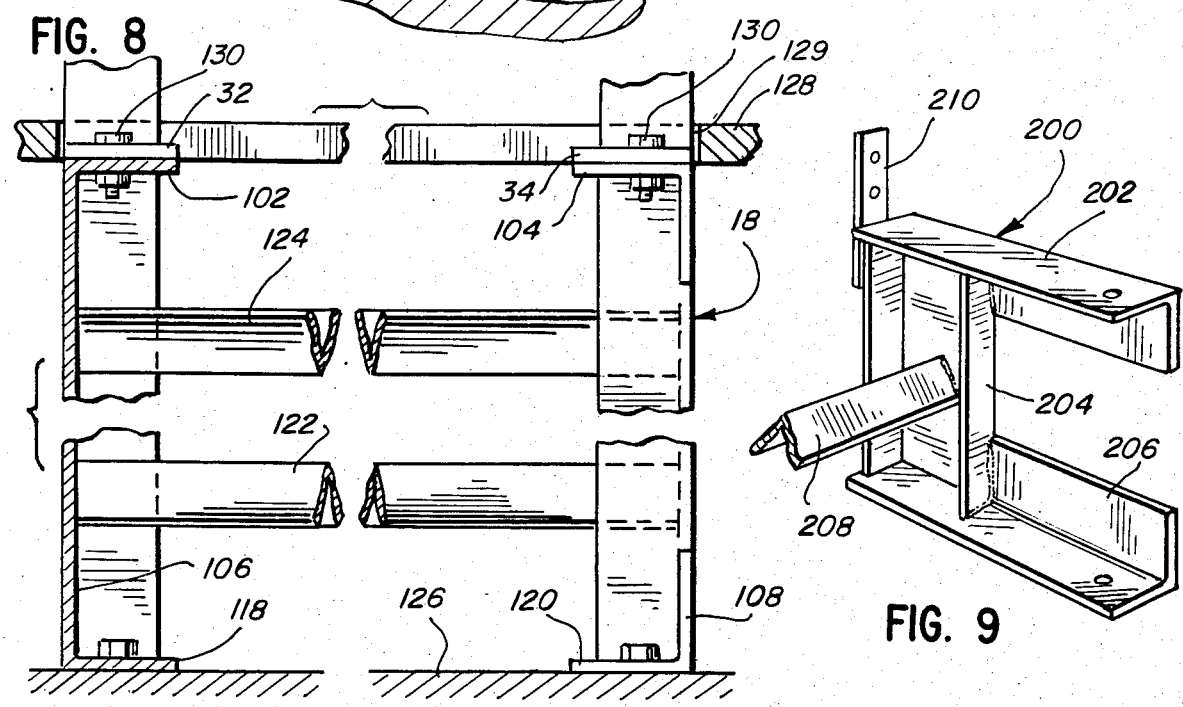
FIG. 8
FIG. 9

QUICK CONNECT FRAME

BACKGROUND OF THE INVENTION

Quick connect frames are a commonly accepted device as part of the wire distribution in a communication system. A typical construction for a quick connect frame is shown in U.S. Pat. No. 3,521,129, issued July 21, 1970, to Joseph Henry MacKenzie, Jr., entitled, "Frame Structure For Wire Termination Blocks".

Wire distribution systems utilizing a plurality of quick connect blocks arranged into block modules is widely accepted. One of the problems encountered in wiring the quick connect blocks is that wires are punched into the quick connect blocks with a conventional wire installing tool. The wires from each of the blocks are then generally routed upright to horizontal jumper rings. It has been discovered that it is necessary to provide a means for positioning the quick connect block outward from the main portion of the frame to provide sufficient space for all of the wires from the quick connect blocks to travel vertically to the jumper rings. In a typical construction, generally U-shaped spacers are utilized to support a block bracket on a support strip. The support strip must be flat so as not to allow tipping of the spacers. The generally U-shaped spacers have been found to create problems in some instances as a result of the impact loading on the spacers when wires are forced into the quick connect block.

In many installations, quick connect frames are part of a communication system utilizing computers which computers are often networked. This results in a large number of wires going from one location to another in a given room, such as a computer room.

An accepted method of providing space for the various wires in a typical communication and computer system is to lay the wires on a floor and then build a floor a short distance above the base floor upon which the wires rest. Persons may walk over the wires on the raised floor without becoming entangled with the wires. It is therefore desirable to provide a convenient means for raising a frame to allow access to lower block modules in the frame even though the frame, because of its weight, is supported on the base floor and not upon a raised floor which has a much lower loading capacity.

The present invention has several principal objects. One of the objects of the present invention is to provide an improved quick connect frame having improved spacers for quick connect blocks, which spacers may withstand repeated high impact loading which occurs when wires are connected into a quick connect block.

Another object of the present invention is to provide an improved support strip for supporting spacers of a block module in a flat attitude.

A still further object of the herein disclosed invention is to provide an improved quick connect frame structure which has a floor extender.

Other objects and uses of the present invention will become readily apparent to those skilled in the art upon a perusal of the accompanying drawings in light of the following specification.

SUMMARY OF THE PRESENT INVENTION

The present invention is directed to an improved construction for a quick connect frame. The frame is used in interconnecting wires which are part of a communication system. The frame includes a pair of uprights with a bridge interconnecting the uprights. Each upright has a foot connected to its lowermost portion to hold the uprights in a generally vertical attitude. A mounting bracket is secured to the uprights to support a block module. A mounting strip is connected to the mounting bracket. The mounting strip includes an integral support bar and a stiffening bar with the bars being substantially mutually perpendicular. A recess is formed in the stiffener bar and the support bar at the junction of the bars to allow the support bar to lay flat on the mounting bracket when a portion of the stiffening bar is cut away. A plurality of spacers is secured to the support bar. Each of the spacers includes an elongated base fixed to the support bar. A post is mounted on each end of the base and a mounting bar interconnects the other ends of the posts. A block bracket is mounted on each of the spacers. Each block bracket receives a conventional quick connect block for receiving a plurality of wires. A head is connected to each foot. A column is secured to each head. An extender foot is fixed to the lower end of each column and supports the columns in a substantially vertical attitude.

DESCRIPTION OF THE DRAWINGS

FIG. 1 is a perspective view of a quick connect frame embodying the herein disclosed invention with the feet and floor extender portion of the frame shown in dotted form;

FIG. 2 is an end elevational view of a pair of block brackets each mounted on a separate pair of spacers which spacers are mounted on mounting strips;

FIG. 3 is an enlarged perspective view showing a block bracket mounted on a pair of spacers with a portion of a quick connect block mounted in the block bracket and a second block bracket positioned below the first mentioned block bracket;

FIG. 4 an enlarged perspecitve view taken on line 4—4 of FIG. 3 showing a cross section of a mounting strip and a portion of a spacer riveted to the mounting strip;

FIG. 5 is an enlarged partial cross sectional view taken on line 5—5 of FIG. 3 showing a portion of a support bar in cross section and a portion of a spacer, a portion of a block bracket, and a portion of a quick connect block;

FIG. 6 is a front elevational view of a plurality of spacers mounted on a mounting strip;

FIG. 7 is an enlarged perspective view of the floor extender shown in dotted form in FIG. 1 with a portion of the quick connect frame of FIG. 1 shown in dotted form;

FIG. 8 is a fragmentary elevational view of the floor extender of FIG. 7; and

FIG. 9 is a fragmentary perspective view of a second form of a floor extender which is particularly adapted for use in connection with a single sided quick connect frame.

DESCRIPTION OF THE PREFERRED EMBODIMENT

Referring now to the drawings and especially to FIG. 1, a quick connect frame embodying the herein disclosed invention is shown therein and is generally indicated by numeral 10. Quick connect frame 10 is a double sided quick connect frame as opposed to a single sided quick connect frame. The improvements which are the subject matter of this invention generally are equally applicable to single sided quick connect frames as well as to double sided quick connect frames. Quick connect frame 10 has on one side three block module areas. Numeral 12 generally indicates an upper block module area. Numeral 14 is directed to an intermediate block module area, and numeral 16 indicates a lower block module area. The block module areas are all identical in construction. Frame 10 also includes a floor extender 18 which constitutes the bottom portion of the frame and is shown in detail in FIGS. 7 and 8.

Frame 10 includes a pair of uprights 20 and 22. The uprights are connected at their uppermost ends by a bridge 24 which provides a convenient means for connecting the uprights. Each of the uprights 20 and 22 is identical in construction to the other uprights. Uprights 20 and 22 are channels and include a web 26 with flanges 28 and 30 formed integral with opposite edges of the web. A foot 32, which is a plate, is welded to the bottom of upright 20 and a like foot 34 is welded to the bottom of upright 22. The feet 32 and 34 form a convenient means for holding the uprights in a vertical attitude when the frame is mounted on a supporting surface without floor extender 18.

Block module area 12 includes a mounting bracket 36 secured to the uprights 20 and 22. The mounting bracket includes a pair of individual mounting brackets 38 and 40 which are identical in construction. Individual mounting bracket 38 includes a vertical bar 42 with offsets 44 and 46 formed integral with opposed ends of the vertical bar. An upright elongated mounting bar platform 48 has the ends of offsets 44 and 46 welded thereto holding vertical bar 42 parallel to upright elongated mounting platform 48 as may be best seen in FIG. 2. The upright elongated mounting platform has its opposite ends secured to flange 28 by conventional screw fasteners 52 and 54.

A conventional ring run 56 constitutes the upper portion of the block module area. The ring run includes a plurality of horizontal jumper rings 58 which are adapted to receive jumpers as is conventional.

A pair of mounting strips 60 and 62 is mounted on the mounting bracket. The construction of the mounting strip 60 is identical to the construction of mounting strip 62 as well as all of the other mounting strips in the frame. Mounting strip 60 is an extruded aluminum angle which is fabricated for mounting in a particular quick connect frame. Mounting angle 60 includes a support bar 64 and a stiffening bar 66. The support bar and stiffening bar are mutually perpendicular with a recess 68 formed in the edges of the support and stiffening bars at the junction of those stiffening bars as may be best seen in FIG. 4. The support strip is notched at its ends, that is, a notch, such as notch 70, is cut in the support strip by removing the stiffening bar at each end. It may be appreciated that the removal of the portion of the stiffening bar 66 leaves a flat surface of support bar 64 for engagement with vertical bar 42 of the mounting bracket so that screw fasteners 71 securing the support bar to the vertical bar create flat surface contact between the parts. Inasmuch as the mounting strip is an extruded section, the recess 68 provides a relief so that there is no additional material on the inner surface of the support bar. Thus, when the stiffening bar is cut away, the support bar is flat and mounting of the support bar on the mounting bracket allows the mounting strip to lay flat. Where there no recess 68 at the junction of the support and stiffening bars, the extrusion process would produce a fillet at the junction and removal of the stiffening bar to form the notch would leave material on the support bar, thereby tending to tilt the mounting strip and tilt materials secured to the mounting strip.

A plurality of identical spacers 72 is mounted on each of the mounting strips. Each of the spacers 72 includes a base 74 fixed to support bar 64 by a pair of conventional rivets 76. Posts 78 and 80 are formed integral with opposed ends of base 74. An inner fastener ear 82 is formed integral with the outer end of post 80 and extends away from post 78. A mounting bar 84 has one end formed integral with the outer end of post 78 and extends toward post 80. The mounting bar includes an outer ear fastener portion 86 which is engageable with the inner fastener ear 82 for connecting the mounting bar to post 80 and thereby form a fastener ear. The fastener ears of all of the spacers on mounting strip 60 all extend in the same direction.

As may be seen in FIGS. 2 and 3, mounting strip 62 has a plurality of spacers fixed thereon. The spacers mounted on mounting strip 62 have the fastener ears extending in the opposite direction to those of the spacers on mounting strip 60. The spacers on mounting strip 62 have the same identical construction as the spacers on mounting strip 60. The spacers on mounting strip 62 are vertically aligned with the spacers on mounting strip 60.

A conventional block bracket 88 is mounted on each pair of vertically aligned spacers on mounting strips 60 and 62. The construction of the block bracket is well known. Each block bracket includes an upper fastening ear 90 and a lower fastening ear 92. A conventional screw fastener 94 is positioned in each of the ears 90. Each screw fastener threadedly engages ear portion 86 and inner fastener ear 82. In the present construction, screw fastener 94 is a self-tapping screw. When the screw fastener is inserted into inner ear portion 86 and through the ear portion, a sufficient load is applied to the ear portion to hold it securely against the inner fastener ear so that when the screw fastener enters the inner fastener ear, ear portion 86 and the inner fastener ear are locked together. The length of the fastener is such that the fastener does not extend entirely through inner fastener ear 82. The fastener does not protrude through the inner fastener ear to become a snag upon which wires may become entangled or a workman may suffer a scratch or bruise. A conventional quick connect block 96 is mounted in each of the block brackets 88.

The quick connect frame includes a plurality of conventional cable retainer brackets 98 mounted on the uprights for holding cable in place. A conventional and well known cable running support 100 is shown mounted on top of bridge 24.

Floor extender 18 may be best seen in FIGS. 7 and 8. The floor extender includes a pair of angle heads 102 and 104 which are adapted for connection to feet 32 and 34, respectively. Columns 106 and 108 are welded to heads 102 and 104, respectively. Columns 106 and 108 are channels each having a web 110 and flanges 112 and 114 formed integral with opposed edges of the web. Each web includes a pair of connecting slots 116 which may be used to secure the column to an adjacent column. Columns 106 and 108 are aligned with their respective uprights 20 and 22. An angle extender foot 118 is welded to the bottom of column 106. Angle extender foot 120 is welded to the bottom of column 108 for holding the frame in an upright attitude. A lower angle connector bar 122 is welded to columns 106 and 108 and an upper angle connector bar 124 has its opposite ends welded to columns 106 and 108 also.

Floor extender 18 is utilized when frame 10 is mounted in what is generally referred to as a computer room. One of the problems attendant a computer room is that there are many wires interconnecting not only portions of telephonic communication system but also various parts of a computer system. An accepted construction to provide adequate space for connecting computer parts is to lay the wires on a base floor and build a false floor or computer floor above the base floor. Floor extender 18 is typically mounted on a base floor 126. A computer floor 128 has an opening 129 to receive frame 10. Feet 32 and 34 are positioned in engagement with heads 102 and 104. Conventional bolts 130 secure the feet to the heads and thereby provide a connected frame. However, the block modules are at a convenient heighth for utilization by a workman for either installation or service of the block modules of the frame.

Looking now to FIG. 9, a portion of floor extender 200 is shown therein which is utilized for a single sided quick connect frame embodying the present invention. FIG. 9 shows only one end of floor extender 200, it being understood that the other end is a mirror image of the end shown. Floor extender 200 includes angle head 202, similar to either head 102 or 104, with a channel column 204 welded to the head. Angle extender foot 206 is welded to the bottom of column 204. A connector bar 208 which is an angle has one end welded to column 204 and the other end is welded to a column like column 204, but the column is not shown. A retainer bracket 210 is fixed to column 204. It may be appreciated that in order to add stability to a single sided quick connect frame, retainer bracket 210 is fixed to the column and is secured to the respective upright of the frame which is aligned with column 204. The other end of the floor extender 200 has a like retainer bracket adapted to be secured to its respective upright.

The instant quick connect frame is utilized as is conventional for quick connect frames in that the mounting strips are secured to the mounting brackets and the spacers are secured to the mounting strips. Conventional block brackets 88 are secured to the spacers and conventional quick connect blocks are mounted in the mounting brackets to make up a block module. Wires are installed in the quick connect blocks by use of conventional wire installation tools. Jumper wires from the blocks are run vertically to the horizontal jumper rings. The utilization of the spacers provides additional room for the vertical run of wires, thereby facilitating the installation and service of the block modules. The utilization of the instant construction of mounting strips holds the mounting strips flat on the mounting bracket so that the spacers are flat and provide an even plane for the block brackets. Thus, the block brackets are vertically secured and lay flat on the spacers, decreasing the possibility of any wobble in the connection between the quick connect blocks and the remainder of the frame. The present construction provides an improvement in quick connect frames over that which has been used heretofore in that the instant frame provides additional space for wires from the quick connect blocks without sacrificing any stability in the frame. It may be appreciated that the specific construction of the spacers is such that each spacer is a closed figure providing a high degree of rigidity so that when wires are inserted in the quick connect blocks by the utilization of the wire installating tool, the repeated impact of the installation procedure does not loosen the spacer or parts thereof and thereby decrease the stability of the parts of a block module.

Although a specific embodiment of the herein disclosed invention has been described in detail above and is shown in detail in the accompanying drawings, it is readily apparent that those skilled in the art may make various modifications and changes in the specific disclosure without departing from the spirit and scope of the present invention. It is to be expressly understood that the instant invention is limited only by the appended claims.

We claim:

1. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module, the improvement comprising; a mounting strip connected to the mounting bracket, a plurality of spacers secured to the mounting strip, each of said spacers having an elongated base secured to the mounting strip, a post connected to each of a pair of opposite ends of the base, each post having one end connected to the base, a mounting bar connected to the other end of the posts interconnecting the posts, said mounting bar being spaced away from the base by said posts, and a block bracket mounted on each of the spacers, each of said block brackets being adapted to receive a quick connect block for receiving a second plurality of wires of the communication system.

2. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to supoort a block module as defined in claim 1, wherein each of said spacers includes a fastener ear connected to the mounting bar.

3. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, wherein the elongated base of each of the spacers is secured to the mounting strip by a rivet extending through the base and a portion of the mounting strip.

4. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, wherein the mounting strip includes a support bar having opposed ends secured to the mounting bracket, a stiffening bar formed integral with the support bar and being substantially perpendicular to the support bar, and an elongated recess formed in the support bar and the stiffening bar at the junction of the support and stiffening bars.

5. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, including; a head connected to each foot, a column secured at one end to each of head and being substantially aligned with its respective upright, and an extender foot fixed to the other end of each column.

6. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, wherein the posts of each spacer are formed integral with the opposite ends of the elongated base, one end of the mounting bar is formed integral with one of the posts, and the other end of the mounting bar is connected to the other post.

7. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, wherein each of said spacers includes a fastener ear connected to the mounting bar, and a screw fastener extending through a portion of the block bracket and into the fastener ear, said fastener having its end within the fastener ear.

8. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, wherein each post having its end connected to the base being formed integral with the base, said mounting bar being formed integral with one of the posts, an inner fastening ear formed integral with the other of said posts extending away from the first mentioned post and positionable adjacent to the mounting bar, and a fastener securing the block bracket to each fastening ear.

9. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, wherein said posts have their ends formed integral with the opposite ends of the base, said mounting bar has one end formed integral with one of the posts, an inner fastening ear is formed integral with the other of said posts, said inner fastening ear extending away from the first mentioned post, and said mounting bar being positionable adjacent to the fastening ear.

10. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, including; a second mounting strip substantially parallel to the first mentioned mounting strip connected to the mounting bracket, a second plurality of spacers secured to the second mounting strip, said second plurality of spacers being equal in number to the first mentioned plurality of spacers secured to the first mentioned mounting strip, and the spacers of the second plurality of spacers each being aligned with a spacer of the first mentioned plurality of spacers and supporting the block bracket mounted on the spacers of the first mentioned plurality.

11. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module as defined in claim 1, including; a second mounting strip substantially parallel to the first mounting strip and being connected to the mounting bracket, a second plurality of spacers secured to the second mounting strip, said second plurality of spacers being equal in number to the number of spacers in the first mentioned plurality of spacers, each of the spacers of the first mentioned plurality having a fastener ear connected to the respective mounting bar and extending in one direction, each of said spacers of the second plurality of spacers including a second fastener ear connected to its respective mounting bar and extending in the direction opposite to the fastener ear of the first mentioned plurality of spacers, the block bracket mounted on each of the first mentioned plurality of spacers being connected to a respective spacer of the second mentioned plurality of spacers, a first fastener securing one side of each block bracket to the fastener ear of each of the spacers of the first mentioned plurality of spacers, and a second fastener securing the other side of each block bracket to the second fastener ear of each of the spacers of the second mentioned plurality of spacers.

12. In a quick connect frame for use in interconnecting a plurality of wires which wires are part of a communication system, said frame having a pair of uprights, means connecting the uprights, a foot connected to the bottom of each upright to hold each upright in a vertical attitude, a mounting bracket secured to the uprights to support a block module, the improvement comprising; a floor extender connected to both feet, said floor extender including a head connected to each foot, a column secured to each of the heads, each column having one end secured to its respective head, an extender foot fixed to the opposite end of each of the columns and being spaced away from the head, a connector connected to the columns, a mounting strip having its opposed ends connected to the mounting bracket, said mounting strip having a support bar, said support bar having opposed ends secured to the mounting bracket, a stiffening bar formed integral with the support bar and being substantially perpendicular to the support bar, and an elongated recess formed in the support bar and the stiffening bar at the junction of said support and stiffening bars.

13. In a quick connect frame for use in interconnecting a plurality of wires which wires are a part of a communication system, said frame having a pair of uprights, means connecting the uprights, a foot connected to the bottom of each upright to hold each upright in a vertical attitude, a mounting bracket secured to uprights to support a block module, the improvement comprising; a mounting strip connected to the mounting bracket, said mounting strip having a support bar having opposed ends secured to the mounting bracket, a stiffening bar formed integral with the support bar and being substantially perpendicular to the support bar, and an elongated recess formed in the support bar and the stiffening bar at the junction of said support and stiffening bars.

14. In a quick connect frame for use in interconnecting a plurality of wires which wires are a part of a communication system, said frame having a pair of uprights, means connecting the uprights, a foot connected to the bottom of each upright to hold each upright in a vertical attitude, a mounting bracket secured to uprights to support a block module as defined in claim 13, including; a head connected to each foot, a column having one end secured to each head, an extender foot fixed to the other end of each column, and a connector connected to the columns.

15. In a quick connect frame for use in interconnecting a plurality of wires which wires are a part of a communication system, said frame having a pair of uprights, means connecting the uprights, a foot connected to the bottom of each upright to hold each upright in a vertical attitude, a mounting bracket secured to uprights to support a block module as defined in claim 13, including; a mounting strip having opposed ends connected to the mounting bracket, a plurality of spacers secured to the mounting strip, each of said spacers having an elongated base secured to the mounting strip, each of a pair of opposed ends of the base having a post connected thereto, each post having one end connected to the base, a mounting bar connected to the other end of the posts interconnecting the posts, a block bracket mounted on each of the spacers, each of said block brackets being adapted to receive a quick connect block for receiving a second plurality of wires of the communication system, a head connected to each foot, a column having one end secured to each head, each column being aligned with its respective upright, an extender foot fixed, to the other end of each column, and a connector secured to the columns.

* * * * *

UNITED STATES PATENT AND TRADEMARK OFFICE
CERTIFICATE OF CORRECTION

PATENT NO. : 4,641,754
DATED : Feb. 10, 1987
INVENTOR(S) : Gregory F. Hebel & Gregg A. Temkin It is certified that error appears in the above-identified patent and that said Letters Patent are hereby corrected as shown below:

Column 3, Line 29, cancel "bar"

Column 6, Line 38, cancel "supoort" and substitute therefor --support--

Column 10, Line 19, cancel the comma after the word "fixed"

Signed and Sealed this

Thirteenth Day of October, 1987

Attest:

DONALD J. QUIGG

Attesting Officer

Commissioner of Patents and Trademarks